United States Patent [19]

Andris et al.

[11] Patent Number: 4,902,371
[45] Date of Patent: Feb. 20, 1990

[54] MASK SHOCK ABSORBING SYSTEM AND METHOD OF USING THE SAME

[75] Inventors: Gerald St. Andris, Poughkeepsie; John P. Gauci, Putnam Valley, both of N.Y.

[73] Assignee: International Business Machines Corporation, Armonk, N.Y.

[21] Appl. No.: 283,437

[22] Filed: Dec. 12, 1988

[51] Int. Cl.⁴ ............................................. B32B 31/16
[52] U.S. Cl. .................................. 156/344; 101/127.1; 101/129; 118/213; 156/64; 156/358; 156/584; 427/282
[58] Field of Search ..................... 101/121, 127, 127.1, 101/128.1, 129; 118/213; 156/344, 584, 64, 358; 427/282

[56] References Cited

U.S. PATENT DOCUMENTS

| | | |
|---|---|---|
| 2,969,828 | 1/1961 | Whittemore. |
| 3,486,441 | 12/1969 | Hillman et al. ........................ 101/35 |
| 3,897,324 | 7/1975 | DelMonte et al. ................. 204/298 |
| 3,949,667 | 4/1976 | Zimmer ................................ 101/119 |
| 4,519,760 | 5/1985 | Norell ................................. 425/113 |

Primary Examiner—Robert A. Dawson
Attorney, Agent, or Firm—Aziz M. Ahsan

[57] ABSTRACT

An apparatus and a method is disclosed for providing a controlled separation of a structure that has been screened from the screening mask. A dampener pad floats with the mask as the screened structure is being separated from the mask. The mask is held in place by the dampener pad while the structure completely separates from the mask. The dampener pad assembly, then, in a controlled manner, brings the mask back to the original position, and the mask is then ready for the next screening operation.

22 Claims, 3 Drawing Sheets

MASK SHOCK ABSORBING SYSTEM AND METHOD OF USING THE SAME

FIELD OF THE INVENTION

The present invention relates generally to a new apparatus and a method in a screening process, and, more specifically, to an apparatus and method for increasing yield of greensheets and other structures after the screening operation. A dampener pad is allowed to float freely or in a controlled manner with the mask as the greensheet is being separated from the mask after the screening operation. During and after the greensheet separation from the mask, the dampener pad assembly controls the mask movement.

BACKGROUND OF THE INVENTION

The use of a separate mask or template or stencil to control the pattern of a material deposition on a portion of a structure is well known. Openings are provided in the sheet of mask material in a pattern which corresponds to the desired pattern to be imparted onto the structure. In most cases, openings are provided on selected portions of the mask through which material depositions are to be made. Such a mask is placed against the structure surface and deposition on the selected portions through the mask openings are made. The materials that are deposited on the structure are approximately of the desired geometrical arrangement. The structure itself may have openings through which the deposited material may pass through or the material may be deposited within those openings. However, the final geometrical pattern of deposited material on the structure following this deposition may differ from the desired geometrical pattern to some extent. This may be due to some of the material getting deposited underneath the mask and along the edges of the openings therein during deposition. This may occur because the sheet of mask material may not be uniformly in contact with the structure surface, thereby leaving gaps between the mask and the structure surface. This may also occur if excessive amounts of deposition material is poured onto the mask and the excessive material overflows onto the structure. The final geometrical pattern may also be different when the mask clings onto the structure, e.g., because of suction that may have been created between the structure and the mask, or, because the deposition material acts like glue, and upon separation deformities and discontinuities occur, as will be discussed later. Even if the method for depositing material on the structure is changed, the new method cannot be expected to alter greatly the result that some deposited material does not create the desired geometrical pattern.

Typical structures upon which material depositions are desired to be made are integrated circuit wafers, greensheets, and substrates which are used to mount thereupon various kinds of electronic devices. The surfaces of these structures against which a mask is to be placed are usually very flat. This, in turn, requires that the mask be very flat against this surface if there is to be uniform contact and gaps are not to occur and that the desired geometrical pattern is obtained.

The gaps between the structure surface and the mask may occur when the structure surface and the mask are forced against one another. If the acting forces are not uniform on the mask, then there is a "bowing" effect on the mask, even though the structure and the mask are symmetrically aligned with one another and even though the mask and the structure surface are both flat and parallel. These gaps may also occur because of the bending of the mask due to the resultant forces acting on it or due to the structure surface pressing against it or due to the mask holder constraining the edge of the mask. Failure of symmetrical and/or parallel alignment or deviations in flatness in the mask sheet itself, all difficult to avoid, are further sources of aggravations for such gaps. When such gaps occur for flat sheet masks which are held by a holder, the deposited material or paste may creep in through the mask openings and into the underside of the mask.

Additionally, when the desired material has been deposited on the structure and the structure is separated from the mask, the material adhering to the underside of the mask and the structure, forces the mask to stick to the structure and move along with it as the structure is being separated or pulled away from the mask. The edges of the mask separate earlier from the structure and the center of the mask area is usually the last mask surface to separate. Prior to complete separation, the center area of the mask creates a bowing configuration, because it is sticking onto the surface of the structure while the rest of the mask surface has separated from the structure.

The material to be deposited usually has a very high degree of viscosity. The deposited material on the surface of the structure forms a continuous contact with the deposited material on the mask through the mask openings and results in an adhesive type of a contact. Due to the high viscosity of the deposited material and the adhesiveness of the deposited material, the mask, which is normally a metal mask, snaps away from the structure upon separation thereby pulling some of the deposited material away from the structure. This "snapping" process creates discontinuities or deformities. Sometimes when the mask separates from the structure, it leaves behind spikes in the pattern, thereby creating a defective structure, as those spikes can result in a short. This happens because the spike usually falls to the side and creates a short between the adjacent lines or geometrical patterns. It has also been found that the spiking level in the center of the structure is significantly higher than that of the spiking level in the perimeter of the structure. The spikes or deformities can also have an adverse effect on any subsequent deposition or on any additional layers that may be placed over it. It is, therefore, desirable to have the mask and the structure surface placed in contact with one another in such a way as to minimize the formation of such gaps and/or spikes and to control the separation of the structure from the mask.

The mask, typically a metal mask, made from, e.g., copper or aluminum or molybdenum sheets or alloys thereof, is attached to a holder. The mask presently in use is made of very thin metal sheets. The mask and the holder are usually held in a stationary position while the structure is allowed to move. Forces that are applied from the structure to the mask result in the mask being flexed into a protrudent shape with resulting substantially convex major surface directed away from the surface of the structure or wafer against which the mask is to form a seal. The protrudent shape of the mask is modified to some extent by the force occurring between the structure and the mask when they are brought together.

In depositing inlaying composition or material through the mask openings, there is a tendency for the paste or similar composition to cling to the mask when the mask is lifted, and the composition sometimes builds up in the mask openings resulting in the production of defective structures. Therefore, the mask has to be kept clean so that this buildup does not adversely contribute to the deformities and discontinuities that are produced during the separation of the mask from the structure.

One way to separate the structure from the mask is to strike a sharp blow, preferably near the center. This will induce a shock wave in the mask, the wave will travel along the mask, and the structure will part from the mask. If this action is imparted to the mask upon completion of each masking operation, there will be no tendency for the structure to adhere to the mask; and thus defective structures may not be produced. This method of separating the mask from the structure may result in damage to the mask and may also result in forcing some of the deposition material to fall onto the structure or be forced into the opening within the structure, thereby making the structure defective again.

In the past one way to solve the problem was to control the machine velocity for the entire mask/structure separation process. This was done either by providing uniform machine velocity or by decreasing the separation velocity. Both of the methods do result in decreasing the number of spikes but they do not eliminate the spiking problem. Decreasing the separation velocity also had a detrimental effect on the thruput capacity of the screening equipment.

Another way of correcting this type of a spiking problem would be to evaluate paste changes. From the studies conducted, it was determined that a paste formulation change is not the answer to the spiking problem.

The present invention reduces the screening process cycle time because the mask movement prior to and after the separation from the structure is controlled. The mask shock absorbing system will eliminate the mask "snapping" during the mask/structure separation. This controlling of the mask during the mask/structure separation will also eliminate spikes and paste ponds due to mask "snapping". This, of course, significantly increases the percentage of structures or greensheets that are not defective because of the "snapping" action of the mask.

SUMMARY OF THE INVENTION

An apparatus for absorbing shock from a mask that is being separated from a structure, comprising, at least one means for absorbing shock, and at least one means for placing the shock absorbing means in contact with the mask prior to the separation of the structure from the mask. Wherein upon separation of the structure from the mask, the shock absorbing means prevents the mask from snapping back by absorbing the shock created when the structure separates from the mask.

A method for controlled separation of a mask from a structure comprising the steps of:
  (a) placing a mask having at least one opening over the structure,
  (b) applying a fluidic medium over the mask so that at least a portion of the fluidic medium passes through the opening in the mask and covers at least a portion of the structure, and
  (c) separating the structure from the mask while simultaneously applying a counter force over the mask so that the mask separates from the structure in a controlled manner.

BRIEF DESCRIPTION OF THE DRAWINGS

The novel features and elements characteristic of the invention are set forth in the appended claims. The invention itself, however, will be best understood by reference to the detailed description which follows in conjunction with the accompanying drawings, wherein:

DETAILED DESCRIPTION OF THE INVENTION

In simple terms, the invention is a mechanical device that would be mounted above the center of a mask. This device would apply a force at the center of the mask during mask/structure separation. This force will prevent the mask from "snapping" at the center during the final stages of separation.

The application of a force at the center of the mask/structure separation process allows the mask and structure to separate with a uniform velocity across the entire structure surface. The force or pressure that is applied by the device on the mask should be such as not to cause any denting or damage to the mask. A person skilled in the art can calculate the minimum force needed to achieve the controlled mask/structure separation without damaging the mask. The minimum force needed would, of course, depend upon the screening conditions as well as the material of the mask.

One area where the present invention is used is during the screening of Multi-Layer Ceramic (MLC) greensheets or substrates. The greensheets can be made of either glass or ceramic or a combination of both.

An important process in MLC screening is the mask/greensheet separation after applying paste to the greensheet. As discussed earlier, a controlled separation process is critical to pattern dimension and quality.

The desired pattern dimensions to be screened are getting smaller and smaller. The smaller pattern on new MLC products result in a higher degree of adhesion between the screening mask and the greensheet. This adhesion, as discussed earlier, can cause several problems with regard to greensheet quality. Various defects occur during mask/greensheet separation. Some of these defects may be repaired. When these defects violate spacing criteria, the greensheet then must be rejected.

Inherent in the mask/greensheet separation process is a mask "snapping" action. Mask "snapping" occurs at the moment the mask and greensheet finally separate from one another. The resiliency of the screening mask adds an unknown velocity component to the actual machine separation velocity setting for the separation process. Therefore, there is a higher separation velocity at the center of the greensheet. A video tape recording was made of the separation process. The video recording confirms that mask "snapping" does provide an additional component to the separation velocity.

Figure 1:
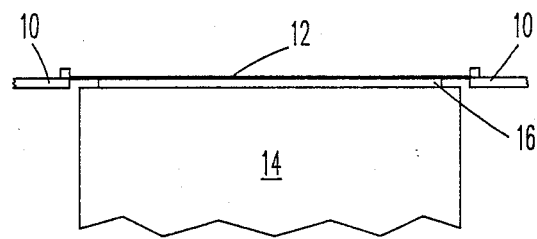
FIG. 1 shows a screening assembly as used presently.
Figure 2:
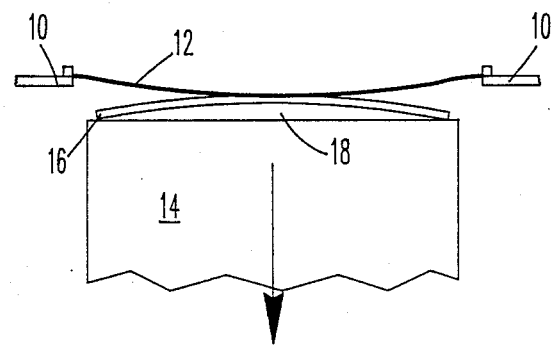
FIG. 2 shows the screening assembly with the greensheet separating from the mask.

FIG. 1 discloses a mask/frame assembly having a mask 12, which is securely attached to a stationary frame 10. Also shown in FIG. 1, is a greensheet/table assembly, where a greensheet 16, or the structure to be screened is securely held by a movable table 14. The table 14, normally moves up and down, but it can be modified to move sideways or can also rotate. Typically, the table 14, slides up to the mask/frame assembly, and the greensheet 16, abuts the mask 12. The mask 12, is usually made of a flexible metallic material; molybdenum, copper, aluminum or alloys thereof are the preferred materials. The mask can also be made of other flexible or non-flexible materials, such as high-strength metals, plastics or composites. The desired patterns to be screened are etched on the mask 12 by processes well known in the art. A paste-like material or material to be screened is poured over the mask 12. Using conventional means or means known in the art, the paste (not shown) is forced down through the openings in the mask 12, onto the greensheet 16, thereby creating a patterned design on the greensheet 16. After the design has been screened on the greensheet 16, the table 14, is then slowly moved away from the mask/frame assembly. The greensheet 16, also moves away from the mask 12. The paste that is poured through the mask 12, onto the greensheet 16, keeps the mask 12, and the greensheet 16, "bonded" together. So, when the table 14, moves away from the mask/frame assembly, the mask 12, tends to stick to the greensheet 16, and tends to move with the greensheet 16. This phenomenon is shown in FIG. 2. As the table 14, moves away from the mask 12, the greensheet 16, has a tendency to adhere to the mask 12. The center surface of the greensheet 16 lifts away from the table 14, and creates an open area 18, while the edges of the greensheet 16, are securely held by the table 14 by clamping means (not shown). Usually, the edges of the mask 12, separate earlier from the greensheet 16, but, the center of the mask 12, however, remains "suctioned" to the greensheet 16. The center of the greensheet 16, and the mask 12, stick to each other until there is sufficient force to overcome the adhesion forces. The greensheet falls towards the table 14, and there is little or no movement in the greensheet 16, upon impact with the table 14. On the other hand the mask 12, is only held by the edge and, therefore, it is free to vibrate.

The movement of table 14, as shown in FIG. 2, creates a concave-type tension in the mask 12. The center of the greensheet 16, also sticks to the center of the mask 12, as discussed earlier, thereby creating a convex-type tension in the greensheet 16. The center of the greensheet 16, lifts off the table 14, prior to separation from the mask 12. This lifting-off sometimes results in the paste to seep underneath the greensheet 16. This seeping of the paste then results in a defective greensheet.

Figure 3:
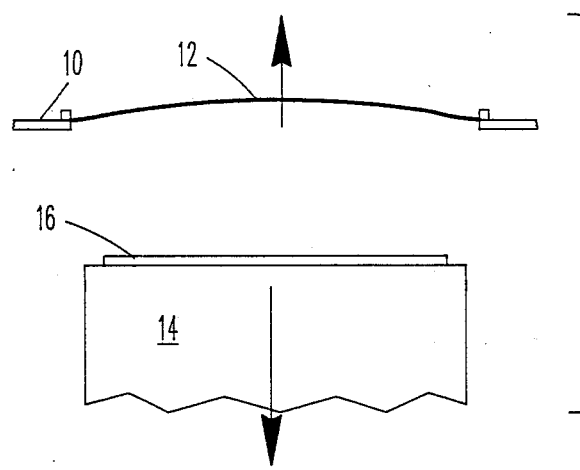
FIG. 3 shows the "snapping" of the mask once the greensheet has separated.

The table 14, along with the greensheet 16, moves slowly away from the mask 12. The mask 12, cannot go any further and at some point, as illustrated in FIG. 3, the mask 12, "snaps" free with considerable upward velocity away from the greensheet 16. This snapping back action results in defects, deformities and discontinuities on the surface of the greensheet 16. This is due to the fact that the pattern or lines that were created by the screening process may short out by the spikes that are formed from the "snapping" action of the mask 12, as discussed earlier.

This is particularly important because under the present technology, the line spacings are decreasing, and even a slight deformity can create a short or a discontinuity which could make the structure defective.

The invention of this application solves the problem of the mask 12, snapping back and creating the discontinuities and deformities in the greensheet 16.

Figure 4:
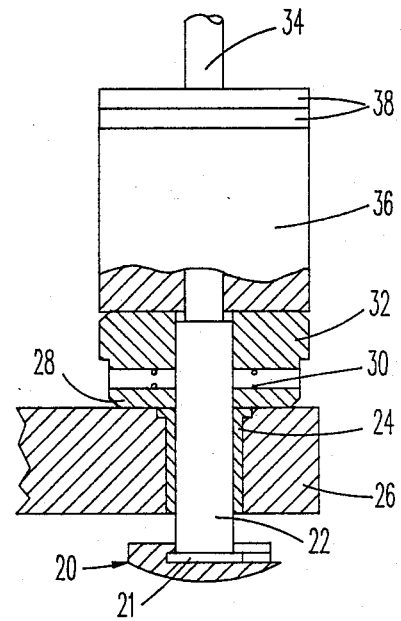
FIG. 4 shows one embodiment of the present invention along with an embodiment of a dampener pad.

One embodiment of the invention is shown in FIG. 4. The dampener pad 20, which can be slidably mounted onto a lip or flange 21, of dampener sleeve 22. Polytetrafluoroethylene, for example, could be a suitable material for making the dampener pad 20. The dampener pad 20, preferably has a convex surface, but the surface shape could be semi-spherical, flat, conical, parabolic, polyhedral, cubical, rectangular, to name a few, or any other shape well known in the art. The dampener pad 20, can also be an integral part of the dampener sleeve 22. The dampener sleeve 22 is assembled with a special spring assembly to a dampener shaft 34. The dampener shaft 34, can be an integral part of the dampener sleeve 22, or it could be arranged by other methods well known to the people skilled in the art. A dampener block 26 having bearing 24 allows the dampener sleeve 22 to slide. A collar 28 connects to a pin spring 30 and a sensor target 32 is attached thereto. The collar 28, is securely attached to the dampener sleeve 22 via a clamping device (not shown). Dampener weight 36, can be slidably placed on top of the sensor target 32. To obtain the desired weight control, additional weights 38, can be slidably placed over the top of the dampener weight 36. Either the dampener weights 36, or additional weights 38, are securely clamped to the dampener shaft 34, by methods well known in the art.

Figure 5:
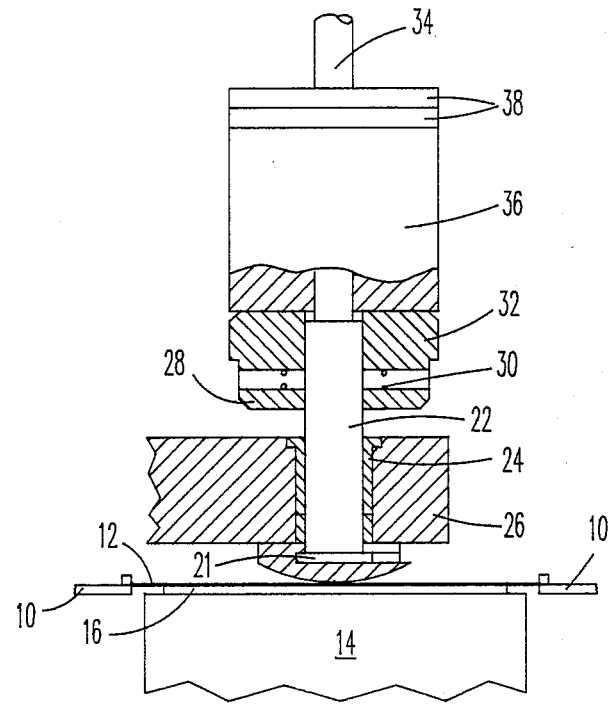
FIG. 5 shows the invention being used with the screening assembly.

As shown in FIG. 5, this dampener assembly is placed on top of the mask 12, and contacts the upper surface of the mask 12. It is within the scope of this invention that the dampener assembly contact other surfaces of the mask 12. Depending on the material of the mask, additional weights 38, may be placed over the dampener weight 36. The force exerted by the additional weights 38, can be increased or decreased to provide a minimum force needed to have a controlled separation as well as elimination of the paste spikes that result from the mask/greensheet separation. The position of the dampener pad 20 or the dampener sleeve 22, may be varied via the dampener weight 36, which is connected to a vertically-adjustable assembly. A separate apparatus (not shown) is used to screen the greensheet 16, by methods well known in the art. After the greensheet 16, has been screened, but before the table 14, is lowered, the dampener pad 20, is brought to contact the surface of the mask 12. The dampener sleeve 22, is slidably engaged to the dampener shaft 34, so that they move with the movement of the mask 12.

Figure 6:
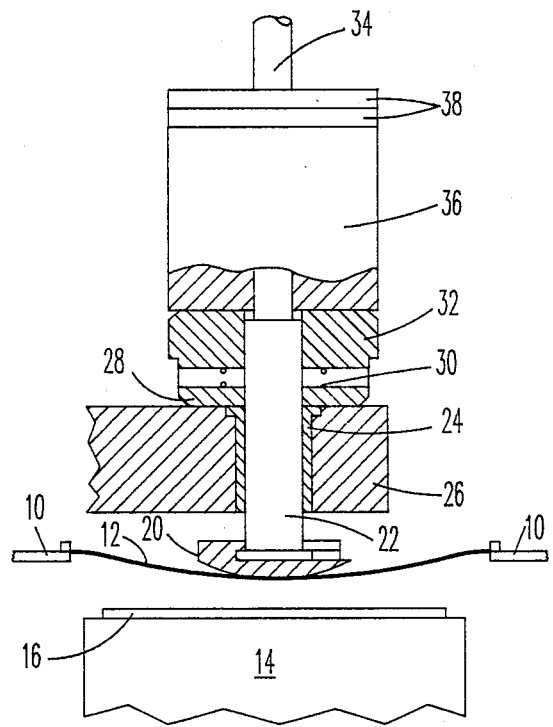
FIG. 6 shows the invention controlling the movement of the mask.

When the table 14, with the greensheet 16, is moved away, the dampener pad 20, because of the forces applied on it, floats downwardly with the mask 12, as shown in FIG. 6. During the initial mask/greensheet separation the dampener pad 20, should only follow the deflection of the mask 12 and move in synchronism with the mask 12. The weight force or other forces applied to the dampener pad 20, may be precisely tuned so as to be equal to the "snapping" force exerted by the mask 12, right after the separation from the greensheet 16. This would allow the shock from the snapping of the mask 12, to be fully absorbed by the dampener pad 20, and its attendant parts. This would prevent any problem of paste spiking or line height variations at the center of the greensheet.

Upon final separation of the greensheet 16, and mask 12, the gap between the dampener block 26, and the collar 28, is closed. The closing of the gap is registered by the sensor target 32. The sensor target 32, then sends a signal to the controller (not shown) to raise the dampener block 26, along with dampener pad 20, up and away from the mask 12. The mask 12, is then allowed to return to its normal horizontal position. The movement of the mask 12, after the final separation from the greensheet 16, can also be controlled by the dampener pad 20. Once the greensheet 16, has completely separated from the mask 12, the mask 12, can then be returned to its original position in a very slow and controlled manner. This can be done by removing the weights 38, or by using pneumatic, hydraulic or electrical means to move the dampener assembly away from the mask 12. The mask 12, is then made ready for the next greensheet 16 screening.

Because the mask 12, is prevented from snapping, the defects described earlier are eliminated.

Figure 7:
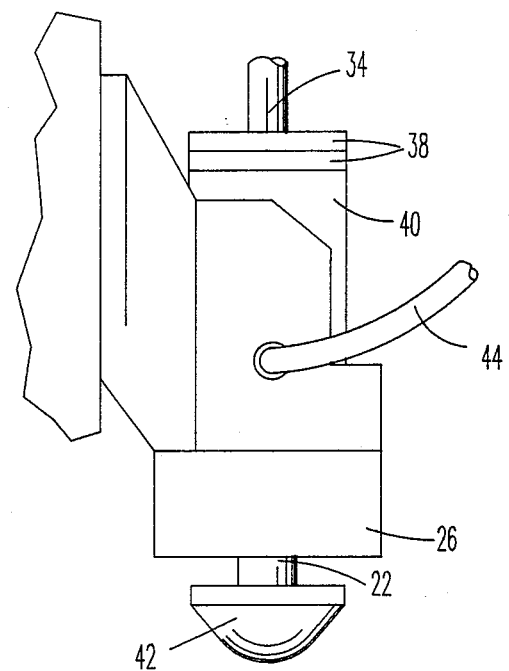
FIG. 7 shows another embodiment of the present invention along with another embodiment of the dampener pad.

FIG. 7, shows another embodiment of the present invention. The dampener pad 42, having a parabolic shape, along with the dampener sleeve 22, is attached to a block dampener 26. A pneumatic or hydraulic line 44, provides means to a piston/cylinder assembly 40, to move the dampener pad 42, in a controlled manner using pneumatic or hydraulic means well known in the art. Additional weights 38, can be mounted on top of the assembly 40, through the dampener shaft 34. This allows the movement of the dampener pad 42, to be controlled using pneumatic or hydraulic means.

As discussed earlier, the movement of the dampener block 26, with the dampener pad 20, can also be controlled via electric motors. The dampener block 26, could be linked to an electric motor, and the electric motor could drive the dampener pad 20, as desired.

Similarly, the movement of the dampener pad 20, could be controlled through a closed loop system where a sensor might be placed on the table 14, which gives feedback to the dampening controller and allows the dampener pad 20, to move accordingly. The dampening controller can be any one of the dampening means discussed earlier.

Figure 8:
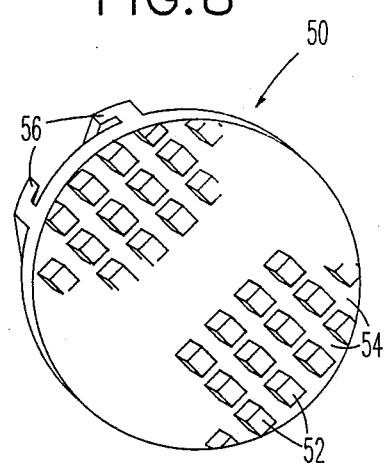
FIG. 8 shows yet another embodiment of the dampener pad.

FIG. 8 shows another embodiment of the dampener pad. The dampener pad 50, having a lip 56, which can be slidably mounted into the lip or flange 21, of the dampener sleeve 22, shows a plurality of stubs or protrusions 52, on the outer surface of the dampener pad 50. The stubs 52, shown can be used to allow the paste that may be on the mask to go into the open area 54, between the stubs 52, instead of the paste being pushed back through the mask 12, and into the greensheet 16, or into the openings within the greensheet 16.

Figure 9:
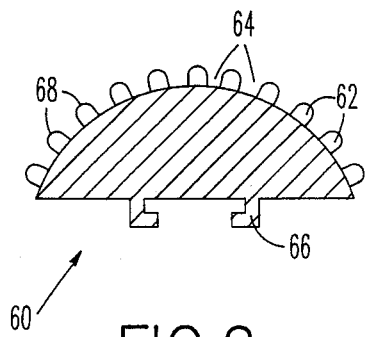
FIG. 9 shows a cross-sectional view of yet another embodiment of the dampener pad.

FIG. 9 shows another embodiment of this dampener pad. The dampener pad 60, has protrusions or stubs 62, and open areas 64. The protrusions 62, have a rounded or spherical surface. The surface 68, of the protrusions 62, can be of any geometrical shape, such as, cubical, conical, semi-spherical, polyhedral, parabolic, convex, flat, rectangular, pyramidical, to name a few, or any other surface shape well known in the art. The lip 66., is used to slidably mount the dampener pad 60, into the lip or flange 21, of the dampener sleeve 22. The space 64, that is created by the protrusions 62, allows the excessive screening material or paste to go into the open area 64, instead of being forced into the greensheet 16, by the dampener pad 60, as discussed earlier.

The shape of the dampener pad should be such as not to cause a vacuum during the separation of the mask from the greensheet. This can also be achieved by holding the surface area contact to a minimum during the mask/greensheet separation, thereby, preventing any vacuum during the separation. Preferably, the dampener pad should contact the mask at the center of the mask, but, the contact points on the mask could be moveable to allow even mask wear. The dampener shaft could also have multiple dampener pads. These multiple dampener pads may or may not be linked together. Of course, the device can have multiple dampener shafts or multiple drives.

Using the mask shock absorbing system of the present invention, the percentage of acceptable screened greensheet was greatly improved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for absorbing shock from a mask that is being separated from a structure, comprising, at least one means for absorbing shock, and at least one means for placing said shock absorbing means in contact with said mask prior to said structure being separated from said mask, wherein upon separation of said structure from said mask said shock absorbing means moving in synchronism with said mask and thereby preventing said mask from snapping back by absorbing the shock created when said structure separates from said mask.

2. The apparatus for absorbing shock from a mask that is being separated from a structure comprising at least one dampener pad cooperating with at least one dampening means, wherein upon the separation of said structure from said mask said dampener pad moves in synchronism with and prevents said mask from snapping back by absorbing the shock created when said structure separates from said mask.

3. The apparatus of claim 1 wherein said means for absorbing shock contacts at least one surface of said mask.

4. The apparatus of claim 1 wherein said means for absorbing shock moves in synchronism with said mask prior to the separation of said structure from said mask.

5. The apparatus of claim 1 wherein said mask has at least one opening.

6. The apparatus of claim 1 wherein a dampening means cooperates with said means for absorbing shock.

7. The apparatus of claim 6 wherein said dampening means are obtained by use of weights.

8. The apparatus of claim 6 wherein said dampening means is a pneumatic means.

9. The apparatus of claim 6 wherein said dampening means a hydraulic means.

10. The apparatus of claim 6 wherein said dampening means is provided by an electric motor.

11. The apparatus of claim 1 wherein the shape of the surface of said means for absorbing shock that contacts said mask is selected from the group comprising convex shape, cubical shape, rectangular shape, flat shape, semi-spherical shape, conical shape, parabolic shape or polyhedral shape.

12. The apparatus of claim 1 wherein said means for absorbing shock is slidably mounted to said placing means.

13. The apparatus of claim 1 wherein said means for absorbing shock has at least one protrusion.

14. The apparatus of claim 13 wherein the shape of the surface of said protrusion is selected from a group comprising convex shape, cubical shape, rectangular shape, flat shape, semi-spherical shape, conical shape, parabolic shape or polyhedral shape.

15. The apparatus of claim 2, further comprising, said dampener pad slidably mounted to a dampener sleeve, said dampener sleeve is slidably attached to a dampener shaft, a dampener block having a bearing, controls the movement of said dampener sleeve, a collar on said dampener sleeve is connected to a pin spring having attached thereto a sensor target cooperates with said dampener block, at least one dampener weight is slidably mounted on said dampener shaft to force said dampener pad to move with said mask and to absorb the shock that results upon the separation of said structure from said mask.

16. A method for controlled separation of a mask from a structure comprising the steps of:

(a) placing a mask having at least one opening over said structure, (b) applying a fluidic medium over said mask so that at least a portion of said fluidic medium passes through said opening in said mask and covers at least a portion of said structure, and (c) simultaneously separating said structure from said mask and applying a counter force over said mask so that said mask separates from said structure in a controlled manner.

17. A method for controlled separation of a mask from a structure comprising the steps of:

(a) placing a mask having at least one opening over said structure, (b) applying a fluidic medium over the mask so that at least a portion of said fluidic medium passes through said opening in said mask and covers at least a portion of said structure, (c) placing a counter force over said mask prior to separation of said mask from said structure, and (d) separating said structure from said mask while simultaneously applying said counter force over said mask so that said mask separates from said structure in a controlled manner.

18. The method of claim 16 wherein said fluidic medium is a paste.

19. The method of claim 16 wherein said counter force is applied using weights.

20. The method of claim 16 wherein said counter force is applied using hydraulic means.

21. The method of claim 16 wherein said counter force is applied using pneumatic means.

22. The method of claim 16 wherein said counter force is applied using an electric motor means.

* * * * *